United States Patent [19]

Hidaka et al.

[11] Patent Number: 5,103,426
[45] Date of Patent: Apr. 7, 1992

[54] DECODING CIRCUIT AND METHOD FOR FUNCTIONAL BLOCK SELECTION

[75] Inventors: Hideto Hidaka; Kazuyasu Fujishima; Yoshio Matsuda, all of Hyogo, Japan

[73] Assignee: Mitsubishi Denki Kabushiki Kaisha, Tokyo, Japan

[21] Appl. No.: 528,511

[22] Filed: May 25, 1990

Related U.S. Application Data

[62] Division of Ser. No. 206,416, Jun. 14, 1988, Pat. No. 4,972,380.

[30] Foreign Application Priority Data

Jun. 16, 1987 [JP] Japan ................... 62-149552

[51] Int. Cl.$^5$ ........................... G11C 7/00; G11C 8/00
[52] U.S. Cl. .................. 365/230.03; 365/68; 365/230.06; 365/231
[58] Field of Search ........... 365/231, 68, 230.06, 365/230.01, 230.03

[56] References Cited

U.S. PATENT DOCUMENTS

| | | | |
|---|---|---|---|
| 4,725,742 | 2/1988 | Tachimori et al. | 365/231 X |
| 4,751,684 | 6/1988 | Holt | 365/231 |
| 4,845,678 | 7/1989 | van Berkel et al. | 365/230.06 |
| 4,972,380 | 11/1990 | Hidaka et al. | 365/230.06 |

Primary Examiner—Alyssa H. Bowler
Attorney, Agent, or Firm—Lowe, Price, LeBlanc & Becker

[57] ABSTRACT

An address decoding circuit for a functional block comprises branch portions serially connected with each other, in which a selecting signal is outputted on one of two output portions in accordance with the first bit information of an address signal when a selecting signal is applied to the first stage branch portion. The second stage output portion, to which the selecting signal is applied, outputs a selecting signal on one of two output portions in response to the second bit information of the address signal, in accordance with the selecting signal. Thereafter, each branch portion of the third to last stages outputs a selecting signal on one of two output portions in response to respective contents of the third bit to last bit of the address signal in accordance with the selecting signal applied from the preceding stage. By this selecting signal, a memory cell as a functional block portion is selected and is activated.

6 Claims, 8 Drawing Sheets

DECODING CIRCUIT AND METHOD FOR FUNCTIONAL BLOCK SELECTION

This application is a division application of application Ser. No. 07/206,416, filed June 14, 1988 now U.S. Pat. No. 4,972,380.

BACKGROUND OF THE INVENTION

1. Field of the Invention

The present invention relates to an address decoding circuit for a functional block and, more particularly, to an address decoding circuit for a functional block which selects and accesses any memory array divided into, for example, a plurality of blocks.

2. Description of the Prior Art

Conventionally, in accordance with a most common method for producing semiconductor memory, a wafer is cut into chips (small pieces), and each cut chip is sealed into a package. Package containing defective chips due to defects on the wafer are removed, thereby improving a yield.

Meanwhile, with development of a technique for semiconductor, it has been considered to integrate a system function on the wafer (Wafer Scale Integration: WSI). In such WSI, deterioration caused by exposure the package and the outside environment can be prevented, whereby reliability can be improved. In addition, the cost of the package and packaging work can be reduced.

Furthermore, in the WSI, a signal delay caused on the package or on a packaging board can be reduced. More specifically, in the method of packaging the wafer, the following steps are required, i.e, wiring between each chip and terminals of the package when the chips cut from the wafer are sealed in packages; arranging those packages on the printed circuit board; and connecting between terminals of each package in accordance with a pattern, whereby signal delay caused by the wiring and the pattern would result. In contrast, in the WSI, since chips are directly wired, the signal delay can be reduced. In addition, the WSI has an advantage that packaging density can be improved.

FIG. 1 is a diagram showing a structure of the conventional WSI. FIG. 1 shows an example of a memory LSI and a plurality of memory arrays Uf's divided into blocks are arranged on a wafer 1. In addition, in the case where memory arrays Uf's include some defects, spare memory arrays Us's to be replaced with those are also arranged. A control signal system, an address signal line and a data input/output line are provided between these pluralities of memory cell arrays Uf's and spare memory arrays Us's, where a branch selecting circuit BS selects any memory in the memory array blocks by an address signal and a branch selecting signal and data is inputted and outputted by a data buffer circuit DB.

If a defective memory block is included in the memory arrays Uf's, it is electrically replaced with a spare memory array Us. Therefore, the desired number of operative blocks can be obtained in the whole wafer. As a result, the address signal and data input/output of the block can be switched by an electrically programmable device (electric fuse).

With a high degree of integration of a MOS RAM of large capacity, the rate of data input/output has been improved conventionally. Each block of the above described WSI conventionally may be driven in either of the following two methods.

(1) The rate of data input/output is increased by implementing the MOS RAM in multibit structure. However, in that case, because 8 bits or 16 bits of data is collectively inputted and outputted in parallel, the area of a parallel operating portion inside the chip is increased and the number of terminals of a package is increased, whereby the degree of integration is disadvantageously diminished at both chip level and packaging level.

(2) Many bits are serially inputted and outputted at high speed with a shift register provided on a data input/output portion. In that case, the above described disadvantage explained in (1) does not occur. However increase in chip area in required for arrangement of the shift register.

As a method which further improves the above described advantage in (2), the following method has been proposed.

(3) The number of terminals of a package are further reduced by serially inputting control signals from one terminal by serially performing address input and data input/output using one terminal.

By a combination of the above described methods (2) and (3), a packaging density is remarkably improved and data can be inputted and outputted at high speed. As an example of such a structure, FIG. 2 shows a dynamic MOSRAM.

Referring to FIG. 2, four terminals i.e. an external terminal $V_{cc}$ (power supply), $V_{ss}$ (ground), a clock input terminal and a data input/output terminal are provided. A dynamic MOSRAM 2 comprises a memory cell array 21, a row decoder 22, a sense amplifier 23, a shift register 24, a serial/parallel converting circuit 25, a row address buffer 26, a control signal generating circuit 27, a data in buffer 28 and a data out buffer 29.

The memory cell array 21 comprises, though not shown, a plurality of word lines, a plurality of bit line pairs crossing the word lines at right angles and memory cells arranged on the intersections of both. The row decoder 22 selects the corresponding word line in response to a row address signal externally inputted to the row address buffer 26 through the data input terminal and the serial/parallel converting circuit 25. When any word line is selected, data stored in memory cells for one selected row appears as a signal potential on the bit line pair. This signal potential is detected and amplified by the sense amplifier 23.

Each memory cell is a one-transistor one-capacitor type and the sense amplifier 23 also operates to refresh data of each memory cell. In addition, the sense amplifier 23 serves as a data latch and it is connected to the shift register 24 for every bit line. The shift register 24 is connected to the data in buffer 28 and data out buffer 29. Data serially inputted to the data input terminal is converted in parallel by the serial/parallel converting circuit 25 and the converted data is applied to the shift register 24 through the data in buffer 28. When data is read, data detected and amplified by the sense amplifier 23 is applied to the shift register 24 and serially selected in accordance with shift operation of the shift register 24 and outputted to the data out buffer 29.

When data is written, data to be written sent from the data in buffer 28 is serially shifted by the shift register 24 and written from the bit line pair to the corresponding memory cell through the corresponding sense amplifier 23. The serial/parallel converting circuit 25 operates to make a serial/parallel conversion in accordance with a clock signal applied to the clock signal input terminal, for outputting data inputted from the data input terminal to the data in buffer 28, row address buffer 26 and control signal generating circuit 27.

FIG. 3A is a timing diagram for explaining operation of the dynamic MOSRAM shown in FIG. 2. FIG. 3 shows an operational timing for a certain cycle, where one cycle is a time period from reset operation to reset operation. When the clock input rises, the data input is at the "L" level. As a result, the memory cell array 21, the shift register 24 and the serial/parallel converting circuit 25 are reset (initialized).

After the reset operation, if the data input becomes "H" level when the clock rises, a certain cycle is started and when the clock falls, a control input, a row address input and a data input are performed and also a data output is started. More specifically, first three-bit input of each cycle $C_0$, $C_1$, $C_2$ are the control inputs thereby specifying basic operation of the cycle. The basic operation comprises ① to ⑤ shown in FIG. 3B.

① Row address set: A cycle for inputting a row address in which the succeeding cycle is performed.

② Reading/refresh: A cycle for detecting and amplifying memory cell data by a sense amplifier.

③ Writing: A cycle for writing data from a shift register to a sense amplifier system.

④ Serial input: A cycle for setting external input data into a shift register.

⑤ Serial output: A cycle for outputting serial data from a shift register.

Any one of the above mentioned operations ① to ⑤ is selected in accordance with a combination of data $C_0$, $C_1$ and $C_2$. The succeeding data inputs from the fourth bit are as follows in accordance with each cycle.

① When a memory cell array of a serial input of a row address is 1M bit and the number of word lines is 1024 ($=2^{10}$), the number of bits of the shift register needs 10 bits.

② and ③ : and As the reading/refresh and writing are of only one cycle, these have nothing to do with the data input.

④ A cycle for serially setting the data input into the shift register. The number of bits as much as the required number is needed. For example, when the memory cell array is 1M bit and the number of sense amplifiers is 1024 ($=2^{10}$), it needs 1024 cycles.

⑤ : A serial data output is performed in order from the first bit. When data for one row is read, it needs 1024 cycles as in the case of ④ .

Memory operation is actually performed by a combination of the above mentioned five kinds of cycles ① to ⑤ .

When the above mentioned driving method is employed in each block of the WSI, it is necessary to input a block address signal in the same manner as the above description and select a block thereby. More specifically, block selection is performed by serially inputting the block address signal to each block in the same manner as that of the above mentioned row address input cycle and serial/parallel converting the same at each block to determine whether it is a block address corresponding to the block or not.

In such a case, a serial/parallel converting system of the block address and a block address decoder are needed at every block. In addition, it is necessary to construct the block address decoder so as to be programmed by a programmable device at every block when it is manufactured because each of the blocks has different circuits. Therefore a circuit structure becomes complicated and area thereof is increased.

FIG. 4 is a diagram showing another example of a conventional block selection. In the example shown in FIG. 4, a plurality of blocks 31 ... 3n and 41 ... 4n are serially interconnected by one address line. A buffer is comprised in each of the blocks 31 ... 3n and 41 ... 4n, and address line fuses 51 ... 5n and 61 ... 6n are connected to the address line corresponding to respective buffers. Therefore, an address signal is serially transferred to each of blocks 31 ... 3n and 41 ... 4n through the address line.

In testing, a good block operating normally is distinguished from a defective block not operating normally, an address line fuse corresponding to the good block is cut and an address line fuse corresponding to the defective block is not cut off, whereby a short-circuit is made between input and output of the buffer so that a bypass is made with the result that the address signal is not inputted into the defective block by the address line fuse. Consequently, the address signal is inputted into only good blocks and only good blocks are serially connected in order. As for the defective blocks, since the address signal is bypassed by the corresponding address line fuse, the address signal is not inputted into the defective blocks The address signal in each block is processed on the bases of 1 bit shift register and if the number of good blocks is n in all, n-bit shift register connected by the address line is provided. In the 1-bit shift register in each block, when the level becomes "H" level, its block becomes "selection" state. A 1-bit "H" level signal is applied as part of the address signal to an address input. Thereafter, the address signal operates the 1-bit shift register in a normal block, while it is transferred from block to block and when the address signal is transferred to a desired block (if the desired block is the i-th block, shift operation is performed i times), the block becomes a selected state. In this method, if the total number of blocks is n, the shift operation needs to be repeated n times. Therefore, the larger the number of blocks, the longer it takes for shift operation.

SUMMARY OF THE INVENTION

It is, therefore, a primary object of the present invention to provide an address decoding circuit for a functional block which can prevent increase of the circuit area and of the delay time.

Briefly stated, the present invention comprises an address decoding circuit for selecting any one of a plurality of functional blocks and for operating the selected functional block wherein, a plurality of branch portions are each serially connected, a selecting signal inputted to an input terminal is transferred to the succeeding stages in order, and a signal is generated which indicates whether any functional block is selected or not at each branch portion in reference to the address signal.

Therefore, according to the present invention, decoding for one digit of address is performed at a branch portion of the address line to each block, whereby address decoding is completed during the address transfer, total area of a block address decoding system can be reduced and the functional block can be highly integrated and can operate at high speed without providing any unnecessary timing or wiring for the block selection.

In a preferred embodiment of the present invention, a branch portion of the first stage comprises a first input portion receiving a selecting signal, a first output portion outputting in accordance with the selecting signal a signal showing that the functional block is selected in response to an address signal, and a second output portion outputting a signal showing that the functional block is not selected. Each of branch portions of the second stage to the last stage comprises a second input portion receiving signals outputted from the first or second output portions of the branch portion of the first stage, a third output portion outputting in accordance with the signal received by the second input portion a signal showing that the functional block is selected in response to an address signal and a fourth output portion outputting a signal showing that the functional block is not selected.

In a further preferred embodiment, each of a plurality of functional blocks comprises memory cells, and accesses the memory cell selected by decoding means.

These objects and other objects, features, aspects and advantages of the present invention will become more apparent from the following detailed description of th present invention when taken in conjunction with the accompanying drawings.

DESCRIPTION OF THE PREFERRED EMBODIMENTS

Figure 5:
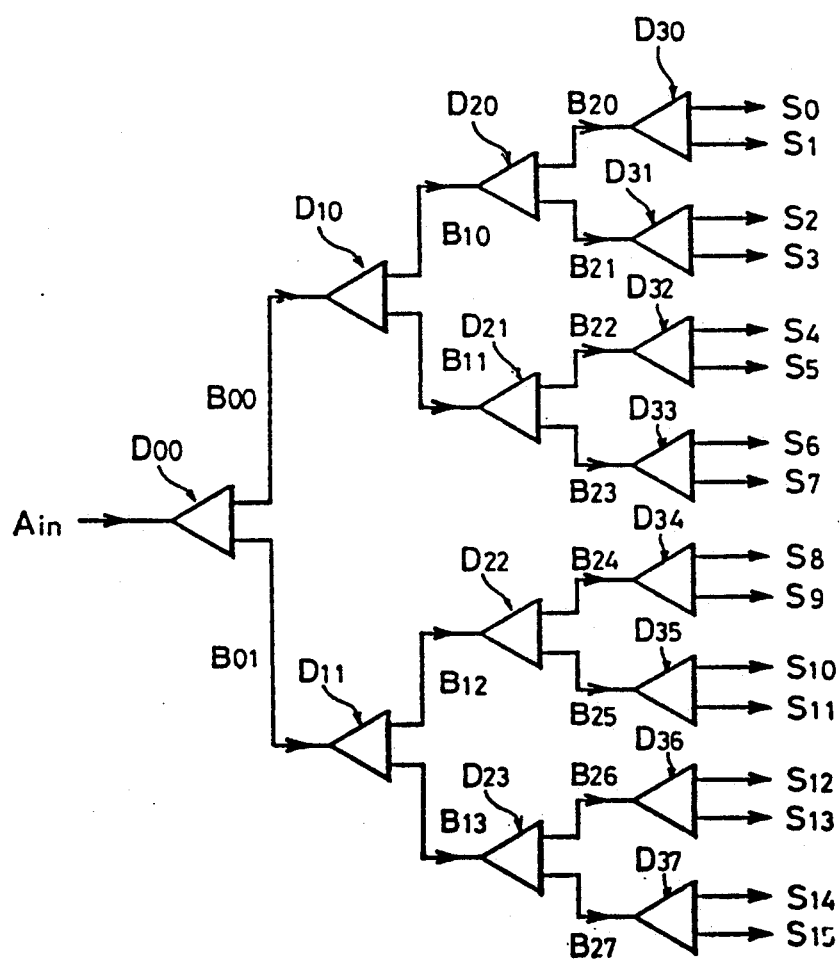
FIG. 5 is a diagram for explaining a concept of one embodiment of the present invention.
Figure 6:
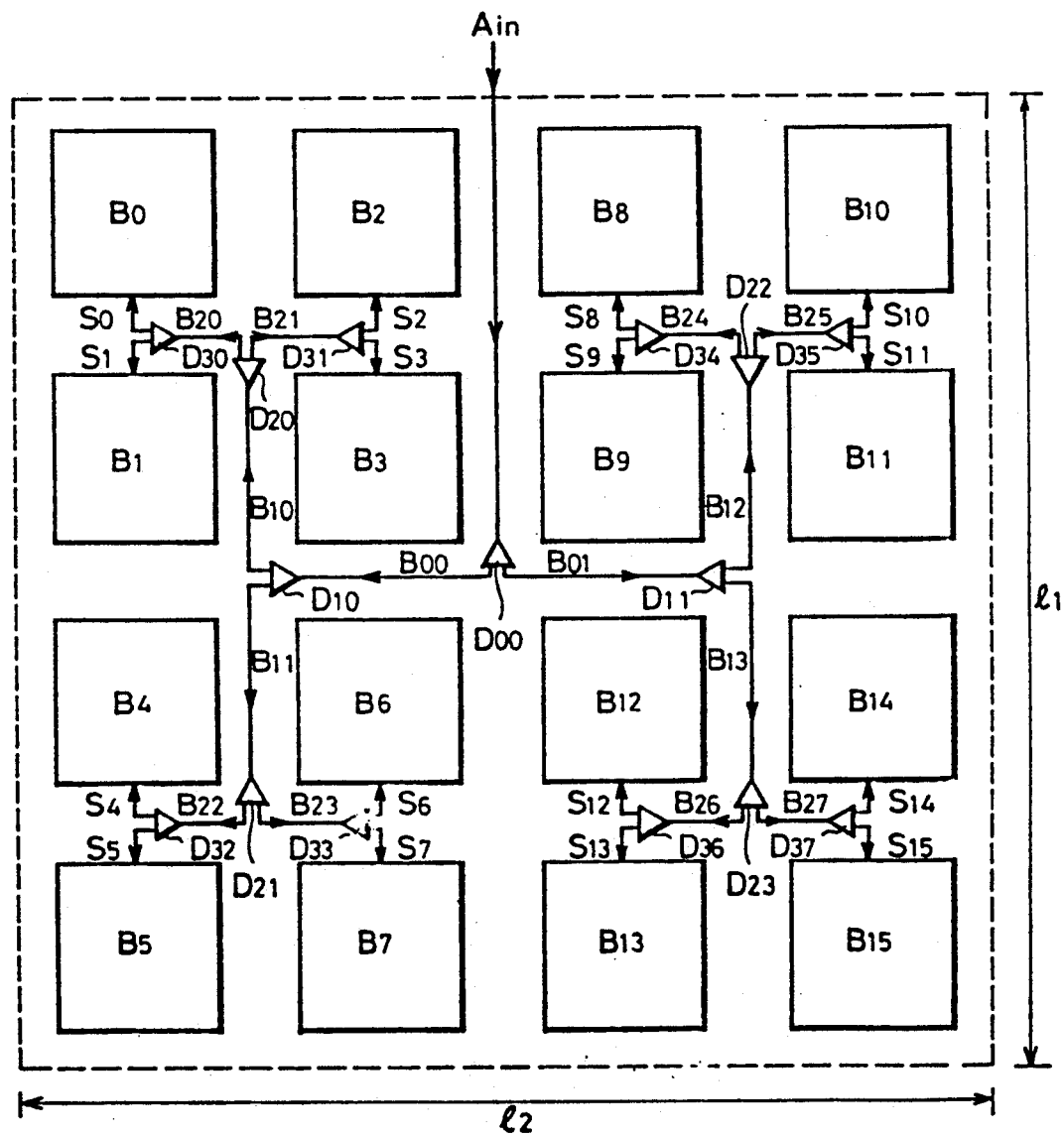
FIG. 6 is a showing a memory block in which one the present invention is applied.

FIG. 5 is a basic conceptual diagram of one embodiment of the present invention and FIG. 6 is a circuit diagram in which one embodiment of the present invention is applied in order to explain a memory block.

Referring to FIG. 5, a description is given of a structure of one embodiment of the present invention. As shown in FIG. 5, when a selecting signal is inputted to branch portion $D_{00}$ to $D_{37}$, the branch portions branch the selecting signal in accordance with an address signal. More specifically, a selecting signal Ain is applied to the branch portion of the first stage $D_{00}$. When the selecting signal Ain is applied to the branch portion $D_{00}$, decoding is carried out for the first bit $A_0$ out of address of a plurality of bits $A_0$, $A_1$, $A_2$, $A_3$). The result of the decoding is outputted as selecting signals $B_{00}$ and $B_{01}$. For example, the selecting signal $B_{00}$ becomes "H" level and the selecting signal B becomes "L" level. Assuming, for example that a selection side is at "H" level, succeeding decoding systems of the side inputted by the selecting signal $B_{01}$ are at non-selection state because the selecting signal $B_{01}$ is at "L" level. The selecting signal $B_{00}$ is applied to a branch portion $D_{10}$ and the selecting signal $B_{01}$ is applied to a branch portion $D_{11}$. The branch portions $D_{10}$ and $D_{11}$ output selecting signals $B_{10}$, $B_{11}$, $B_{12}$ and $B_{13}$ in the form of e.g. the logical product of the second bit $A_1$ of the address signal and the decoded result of the first bit $A_0$, such as $(B_{10}, B_{11}, B_{12}, B_{13}) = (0, 1, 0, 0)$.

Figure 1:
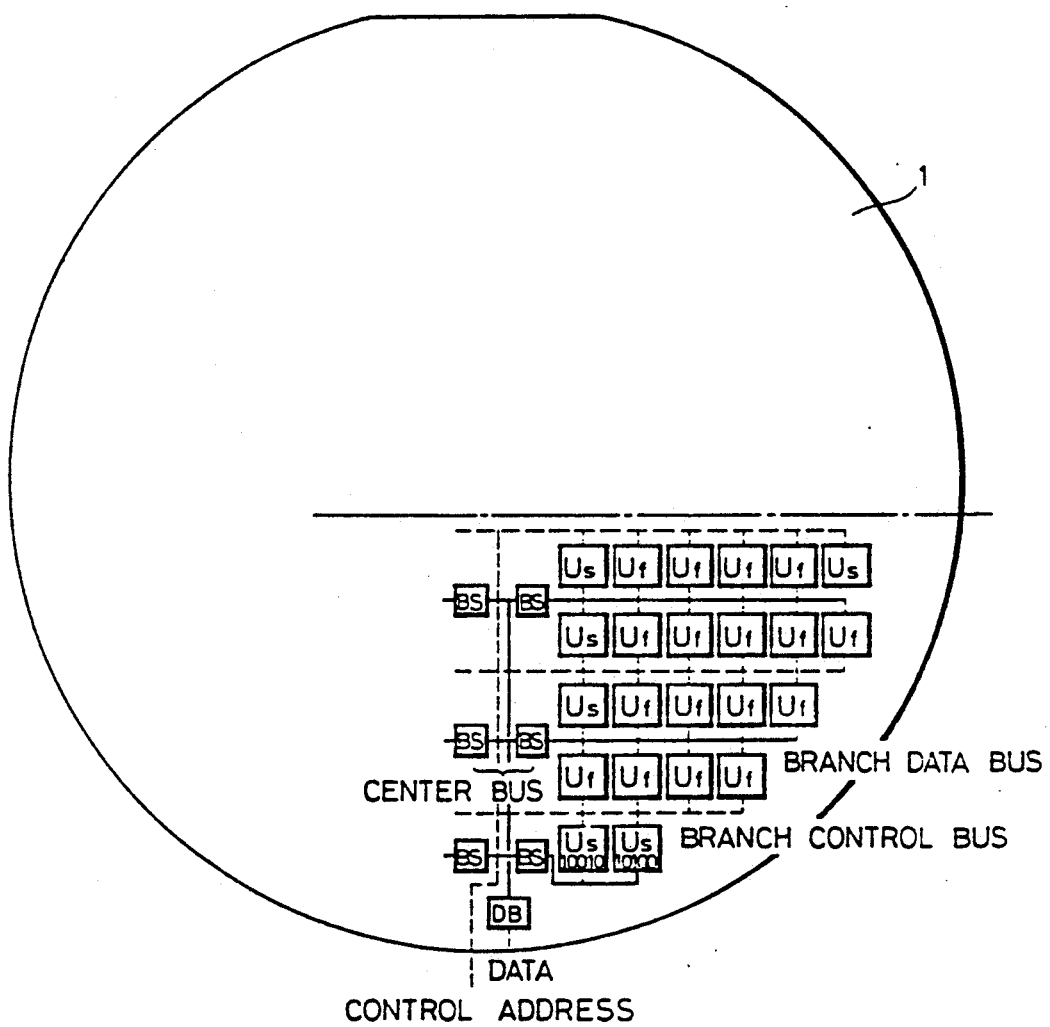
FIG. 1 is a conceptual diagram showing one example of the conventional WSI.
Figure 2:
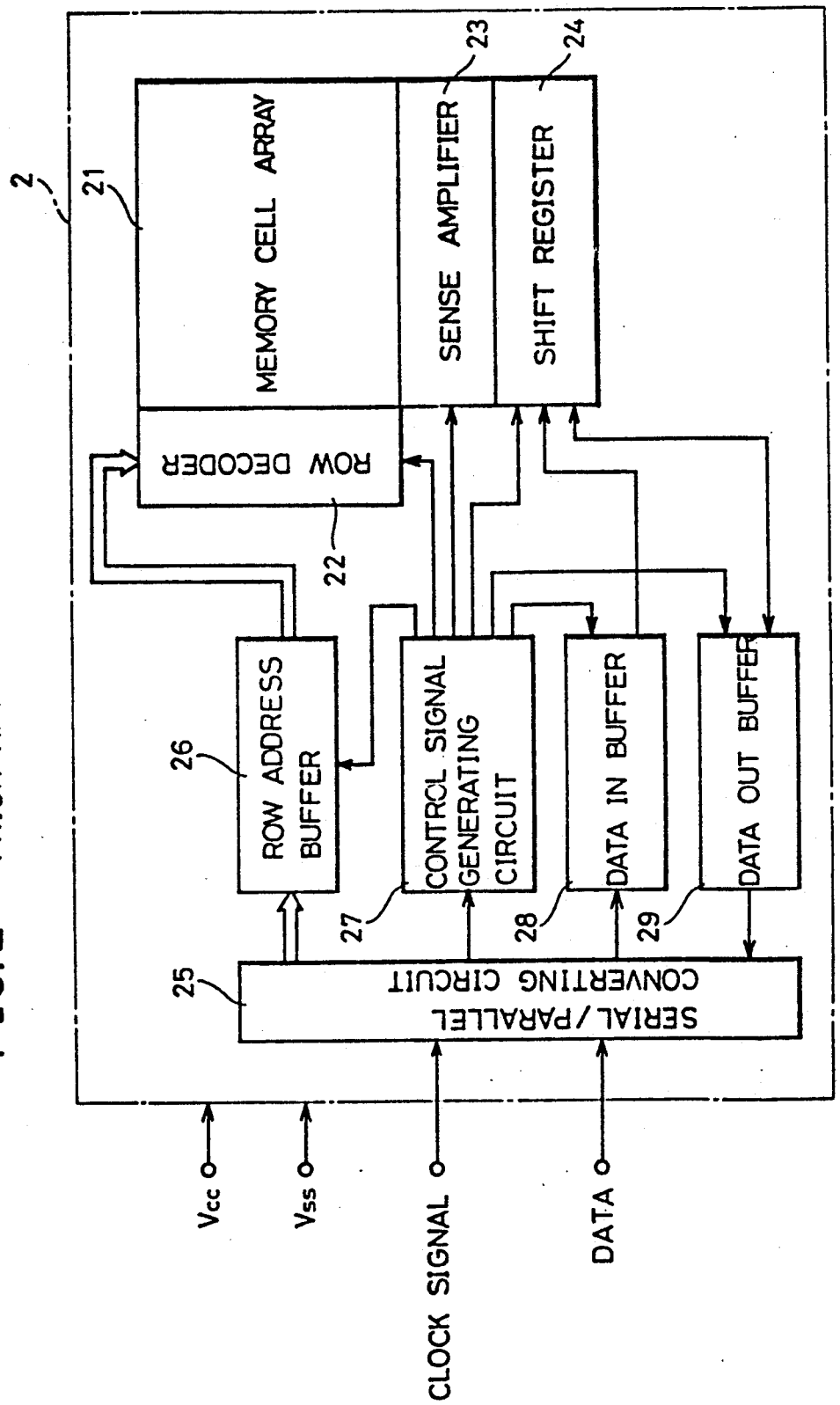
FIG. 2 is a schematic block diagram showing a structure of a conventional dynamic MOSRAM.
Figures 3A, 3B:
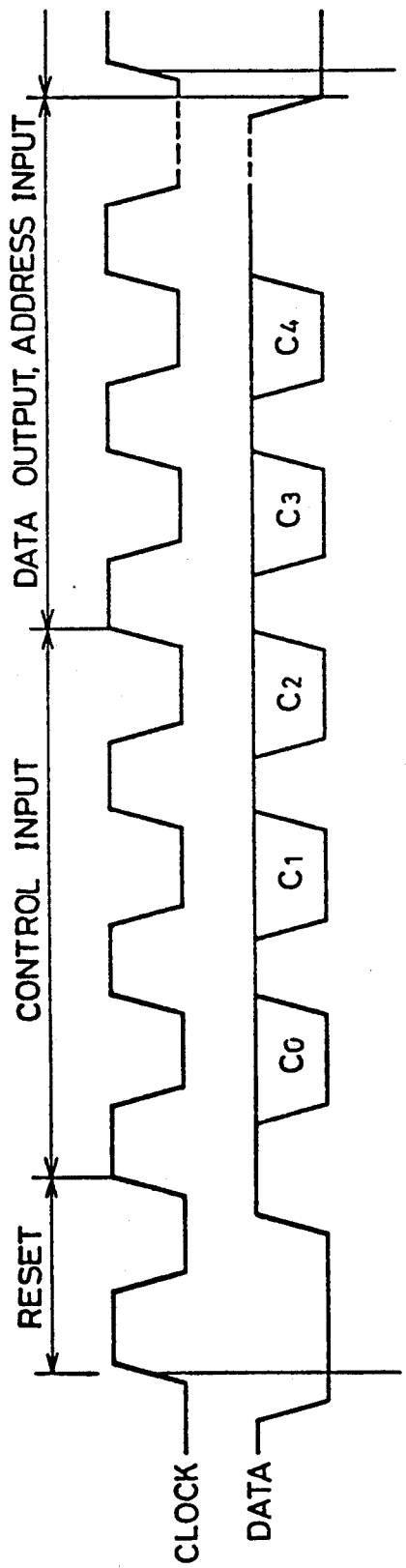
FIG. 3A a waveform diagram for explaining operation of the dynamic MOSRAM shown in FIG. 2
FIG. 3B is a explaining each mode.
Figure 4:
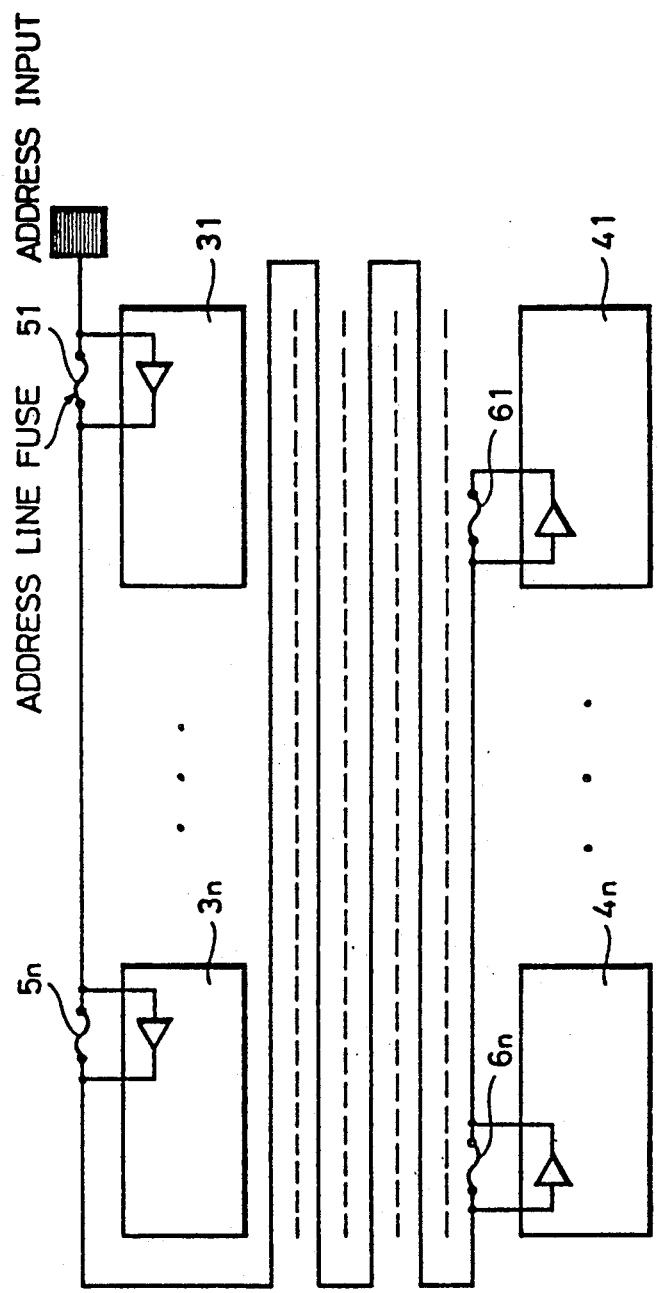
FIG. 4 is a diagram for explaining another example of the conventional block selection.

In addition, branch portions $D_{20}$, $D_{21}$, and $D_{23}$ show that any one of the selecting signals $B_{20}$, $B_{21}$... $B_{27}$ is "selected" and the other selecting signals are all "non-selected" in the form of the logical product of the third bit $A_2$ of the block address signal and the selecting signals $B_{10}$, $B_{11}$, $B_{12}$ and $B_{13}$. Such decoding operations are serially repeated over many stages, for example, four-stage decoding operations are carried out by four bits $A_0$, $A_1$, $A_2$ and $A_3$ of the block address in the example in FIG. 1, with the result that any one of sixteen final outputs $S_0$, $S_1$... $S_{15}$ is "selected" and the other selecting signals are "non-selected". Therefore, it follows that one block is selected out of sixteen blocks.

The decoding circuit shown in FIG. 5 is arranged corresponding to each of the memory blocks $B_0$ to $B_{15}$ shown in FIG. 6. More specifically, the branch portion $D_{30}$ is arranged corresponding to memory blocks $B_0$ and $B_1$; the branch portion $D_{31}$ is arranged corresponding to memory blocks $B_2$ and $B_3$; the branch portion $D_{32}$ is arranged corresponding to memory block $B_4$ and $B_5$; and the branch portion $D_{33}$ is arranged corresponding to memory blocks $B_6$ and $B_7$. Furthermore, the branch portion $D_{34}$ is arranged corresponding to memory blocks $B_8$; and $B_9$; branch portion $D_{35}$ is arranged corresponding to memory blocks $B_{10}$ and $B_{11}$; the branch portion $D_{36}$ is arranged corresponding to memory blocks $B_{12}$ and $B_{13}$; and the branch portion $D_{37}$ is arranged corresponding to memory blocks $B_{14}$ and $B_{15}$.

As a result, if the final output $S_0$ showing "selection" is outputted from the branch portion $D_{30}$, for example, the memory block $B_0$ is selected. In the same manner, if any one of the final outputs $S_1$ to $S_{15}$ shows "selection", then it means any one of memory blocks $B_1$ to $B_{15}$ is selected. All memory blocks $B_0$ to $B_{15}$ are connected with an equal "depth" in view of the input side of the address by arranging the branch portion $D_{00}$ to $D_{37}$ in the above described manner. More specifically, all memory blocks $B_0$ to $B_{15}$ are selected through the four-stage decoding circuit. In addition, assuming that the dimensions of the memory blocks $B_0$ to $B_{10}$ and $B_5$ to $B_{15}$ are $l_1$ and $l_2$, respectively, respective wirings to any branch portions is the sum of $l_1/2$, $l_2/4$, $l_1/4$ and $l_2/8$.

Therefore, there is no difference in operation timing between each of the blocks $B_0$ to $B_{15}$ and entirely equal operation can be performed regardless of the position of the selected memory block. The decoding using the arrangements of memory blocks and the branch of wirings can be referred to as a Tree Decode method. According to the Tree Decode method, it is not necessary to provide a block address decoder at each block and the block decoding line can be realized in which the number of circuit stages encountered before a block is selected is small.

Figure 7:
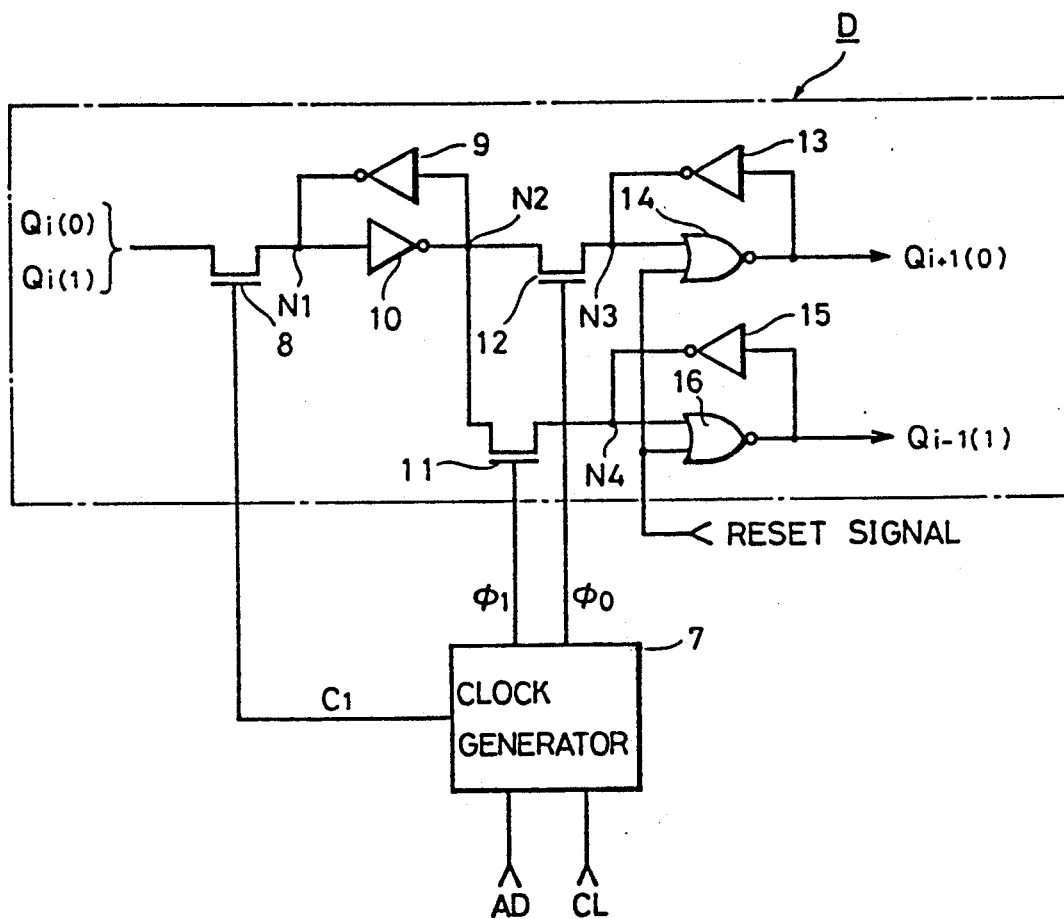
FIG. 7 is an concrete electric circuit diagram showing a branch portion contained in one embodiment of the present invention.

FIG. 7 is an electric circuit diagram of the branch portion shown in FIGS. 5 and 6. Referring to FIG. 7, a description is given of a structure of a branch portion D. If the branch portion D corresponds to the branch portion $D_{00}$ shown in FIG. 5, selecting signal Qi(0) or Qi(1) corresponds to the selecting signal Ain and if the branch portion D corresponds to branch portion $D_{10}$ to $D_{37}$, the selecting signal Qi(0) or Qi(1) corresponds to selecting signal $B_{00}$ to $B_{27}$. The selecting signal is applied to the drain of the MOS transistor 8, and the source of the MOS transistor 8 is connected to a node N1. The node N1 is connected to an output of an inverter 9 and an input of an inventor 10, and an input of the inverter 9 and an output of the inverter 10 are connected to a node N2. These inverters 9 and 10 constitutes a latch circuit.

The node N2 is connected to respective drains of MOS transistors 11 and 12. The MOS transistor 12 has its source connected to a node N3 and the MOS transistor 11 has its source connected to a node N4. The node N3 is connected to an output of an inverter 13 and one input of an NOR gate 14. An input of the inverter 13 is connected to an output of NOR gate 14, and an output signal of the NOR gate 14 is outputted as $Qi_{+1}(0)$. The inverter 13 serves to decide a potential of the node N3 and constitutes a latch circuit with the NOR gate 14. The node N4 is connected also to an output of an inverter 15 and one input of an NOR gate 16. An input of the inverter 15 is connected to an output of the NOR gate 16 and an output signal of this NOR gate is outputted as $Qi_{-1}(1)$. The inverter 15 serves to decide a potential of the node N4 and constitute a latch circuit with the NOR gate 16.

An input take-in signal $C_1$ is applied from a clock generator 7 to the gate of the MOS transistor 8, a clock pulse $\phi_1$ is applied to the gate of the MOS transistor 11 and a clock pulse $\phi_0$ is applied to the gate of the MOS transistor 12. Address input signal AD and control signal CL are applied to the clock generator 7. In addition, a reset signal is applied to respective other inputs of the NOR gates 14 and 16. Although only one clock generator 7 is provided in common to the branch portions $D_{00}$ to $D_{37}$ in the example shown in FIG. 5, it may be provided individually to respective branch portions $D_{00}$ to $D_{37}$.

Basic operation of the branch portion shown in FIG. 7 corresponds to a region of a shift register. The branch portion D decides whether data of one bit applied to that region should be shifted or not by the address input signal AD inputted serially, and it successively shifts initialized data for example Ain ="H" level). When data is shifted by all address bits, only the block to which data is transferred becomes a selected state. At this time, a selecting signal of "H" level is not applied to non-selected blocks.

Figure 8:
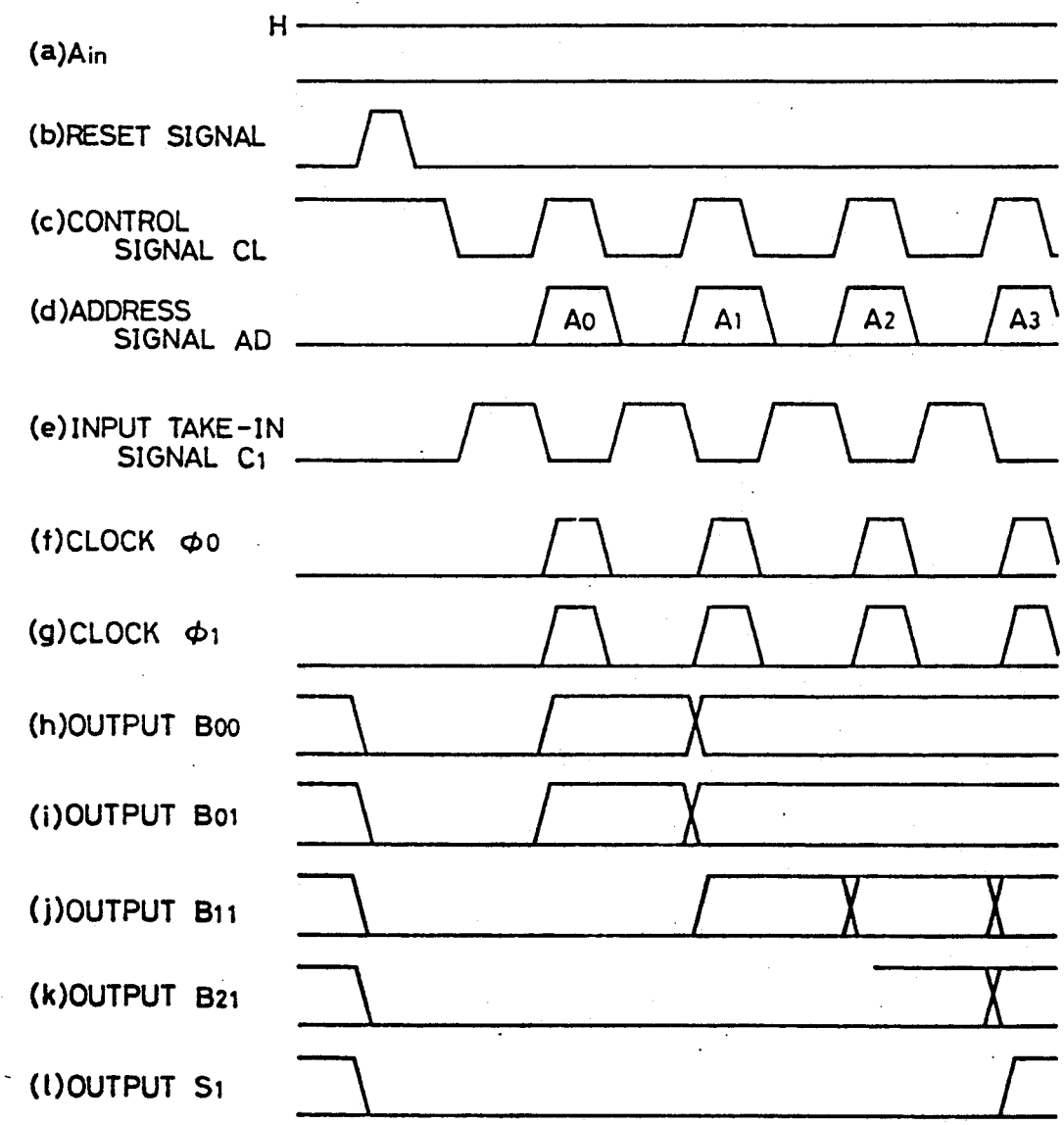
FIG. 8(a)–8(l) are waveform diagrams for explaining operation of the branch portion shown in FIG. 7.

FIG. 8 is a waveform diagram for explaining operation of FIG. 7. Referring to FIG. 8, a description is given of operation of the branch portion shown in FIG. 7. As one example, operation of the branch portion $D_{00}$ of the first stage shown in FIG. 5 is to be considered.

① The selecting signal Ain is set to "H" level as shown in FIG. 8(a). Then, when a reset signal shown in FIG. 8(b) becomes "H" level, the NOR gates 14 and 16 make respective output signals $Qi_{-1}(0)$ and $Qi_{-1}(1)$ "L" level. At this time, the inverters 13 and 15 invert respective outputs of the NOR gates 14 and 16 to "H" level and apply them to the nodes N3 and N4.

② When the input take-in signal $C_1$ becomes "H" level as shown in FIG. 8(e), the MOS transistor 8 is turned on and the inputted "H" level signal is outputted on the node N1. At this time, respective nodes N1 of the other branch portions to $D_{10}$ to $D_{37}$ all remain at "L" level. This is based on the fact that the selecting signal Ain is "H" level and the reset signal is set to "H" level.

③ If the first bit $A_0$ of the address input signal AD becomes "L" level, the clock generator 7 set the clock pulse $\phi_0$ to "H" level and if the first bit $A_0$ becomes "H" level, it sets the clock pulse $\phi_1$ to "H" level. Since the "H" level signal at the node N1 has been inverted to "L" level by the inverter 10, the MOS transistor 12 is turned on when the clock pulse $\phi_0$ becomes "H" level and a "L" level signal outputted on the node N2 is outputted on the node N3. At this time, since the reset signal is at "L" level, the NOR gate 14 outputs an "H" level signal as the output $Qi_{+1}(0)$. At this time, since the clock pulse $\phi_1$ is at "L" level and the output of "H" level of the NOR gate 16 is applied to the node N4, the node N4 remains "H" level. Therefore, the NOR gate 16 outputs the "L" level signal as the output $Qi_{-1}(1)$.

On the other hand, if the first bit $A_0$ of the address input signal AD becomes "H" level, the clock pulse $\phi_1$ becomes "H" level. Contrary to the above description, since the node N4 becomes "L" level, the NOR gate 16 outputs a "H" level signal as the output $Qi_{-1}(1)$ and, since the node N3 is at "H" level, the NOR gate 14 outputs a "L" level signal as the output $Qi_{+1}(0)$. More specifically, either the output signal $Qi_{+1}(0)$ which corresponds to the $B_{00}$ in FIG. 5) or the output signal $Qi_{-1}(1)$ (which corresponds to the $B_{01}$ in FIG. 5) becomes "H" level in accordance with "0" and "1" of the first bit $A_0$ of the address input signal AD. As a result, decoded outputs are outputted as the $B_{00}$ and $B_{01}$ corresponding to the first bit $A_0$ of the address input signal AD.

④ The above described operation of ② is performed and the operation is performed on the second bit $A_1$ of the input address signal AD and, as a result, any one of the selecting signals $B_{10}$, $B_{11}$, $B_{12}$ and $B_{13}$ becomes "H" level.

⑤ When the above described operation of ④ is performed in connection with the third bit $A_2$ and the fourth bit $A_3$ of the address input signal AD, any one of the output signals $S_0$, $S_1$ . . . $S_{15}$ becomes "H" level, whereby the corresponding memory block is selected and activated.

As described above, according to the Tree Decode method in accordance with one embodiment of the present invention, it is not necessary to provide a block address decoder at every block nor to increase a wiring of an address line, whereby total area can be reduced. Furthermore, unnecessary timing for decoding is not required.

Although a description is given of the case where one out of sixteen memory blocks is selected in the example shown in FIG. 6, the number of clocks and the blocks finally selected is not limited to this and the present invention is applicable to any case. In addition, although each block is formed by a memory device, each block may be formed by a CPU. In such a case, a selected CPU performs operational functions.

As described above, according to the present invention, total area of a block address decoding system can be reduced and unnecessary timing and wirings for selecting a block are not required, whereby a functional block can be highly integrated and the block operates at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An address decoding circuit for selecting any one of a plurality of functional blocks, structurally arranged in a matrix and integrated in a single wafer, in response to a serial address signal applied to a single input terminal at a peripheral area of said matrix, comprising:

a plurality of successive tree decoder stages, related in number to the number of functional blocks, and collectively including a plurality of logic circuits structurally distributed within the matrix, each logic circuit located separately from other logic circuits, a first stage of said tree decoder stages located centrally in said matrix and directly connected to said input terminal, each successive tree decoder stage directly connected to a prior stage, a final stage connected to said functional blocks; and wherein a conduction path length to any selected functional block, from the input terminal through said successive tree decoder stages, is substantially the same length as a conduction path length from the input terminal through said successive tree decoder to any other selected functional block.

2. An address circuit as recited in claim 1, wherein each logic circuit has an input and two outputs, said first stage comprising only one of said logic circuits, the input thereof directly connected to said input terminal and each output thereof directly connected to a logic circuit input of a successive stage.

3. An address decoding circuit as recited in claim 2, wherein each successive stage comprises twice the number of logic circuits as an immediate prior stage.

4. An address decoding circuit as recited in claim 3, wherein only a single logic circuit of each successive stage is activated to select a functional block.

5. An address decoding circuit as recited in claim 1, wherein said functional blocks comprise memory arrays.

6. An address decoding circuit for selecting any one of a plurality of functional blocks in accordance with a serial address signal applied at a single input terminal and for operating a selected functional block to function comprising:

first and second logic circuits each including an input terminal and a pair of output terminals;

first and second functional block portions formed on opposite sides of said first logic circuit and connected to said outputs of said first logic circuit through respective first and second paths, said first logic circuit connected to said single input terminal for receiving said serial address signal, said first functional block portion including said second logic circuit and first and second functional block sections formed on opposite sides of said second logic circuit, said first and second sections connected in said first path to the output terminals of said second logic circuit through respective paths of equal length, the input of said second logic circuit connected to one of the output terminals of said first logic circuit.

wherein said second functional block portion includes a third logic circuit and third and fourth functional block sections formed on opposite sides of said third logic circuit and connected in said second path to the output terminals of said third logic circuit through respective paths of equal length, the input of said third logic circuit connected to the other one of the output terminals of said first logic circuit, and wherein said first and second paths are of equal length.

* * * * *